US009275745B2

(12) United States Patent
Won et al.

(10) Patent No.: US 9,275,745 B2
(45) Date of Patent: Mar. 1, 2016

(54) SEMICONDUCTOR DEVICE AND METHOD OF OPERATING THE SAME

(71) Applicant: SK hynix Inc., Gyeonggi-do (KR)

(72) Inventors: Sam Kyu Won, Gyeonggi-do (KR); Duck Ju Kim, Gyeonggi-do (KR); Won Kyung Kang, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 197 days.

(21) Appl. No.: 13/934,994

(22) Filed: Jul. 3, 2013

(65) Prior Publication Data
US 2014/0258611 A1   Sep. 11, 2014

(30) Foreign Application Priority Data

Mar. 5, 2013 (KR) .................. 10-2013-0023387

(51) Int. Cl.
*G06F 3/06* (2006.01)
*G11C 16/22* (2006.01)
*G11C 8/20* (2006.01)
*G11C 7/02* (2006.01)

(52) U.S. Cl.
CPC *G11C 16/22* (2013.01); *G11C 7/02* (2013.01); *G11C 8/20* (2013.01)

(58) Field of Classification Search
CPC . G06F 11/3037; G06F 3/0614; G06F 3/0688; G06F 3/0652
See application file for complete search history.

(56) References Cited

U.S. PATENT DOCUMENTS

| 7,813,184 B2* | 10/2010 | Kim et al. ............... 365/185.29 |
| 8,605,533 B2* | 12/2013 | Seo ............................... 365/226 |
| 8,738,974 B2* | 5/2014 | Honda ............................. 714/53 |
| 8,762,797 B2* | 6/2014 | Serebryany et al. .......... 714/702 |
| 2006/0059385 A1* | 3/2006 | Atri et al. ......................... 714/14 |

FOREIGN PATENT DOCUMENTS

| KR | 100854970 | 8/2008 |
| KR | 1020110131984 | 12/2011 |

* cited by examiner

*Primary Examiner* — Christian P Chace
*Assistant Examiner* — Tracy A Warren
(74) *Attorney, Agent, or Firm* — IP & T Group LLP

(57) ABSTRACT

A semiconductor device includes a memory cell array includes a plurality of memory blocks, each of the memory blocks including a plurality of pages, wherein at least one of the plurality of memory blocks functions as a first storage unit to store a plurality of page addresses associated with the plurality of pages. A second storage unit loads a page address stored in the first storage unit. A control circuit is configured to cancel a program operation if an externally inputted page address is less than or equal to the page address loaded into the second storage unit, and perform the program operation and update the second storage unit with the externally inputted page address if the externally input page address is greater than the page address loaded into the second storage unit.

13 Claims, 7 Drawing Sheets

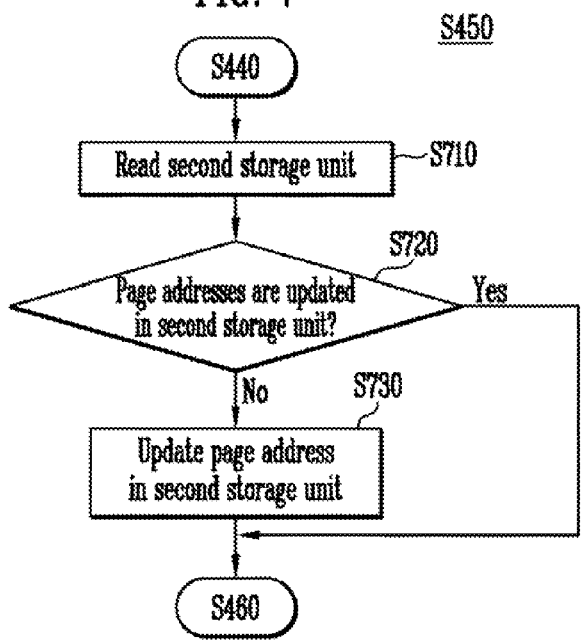
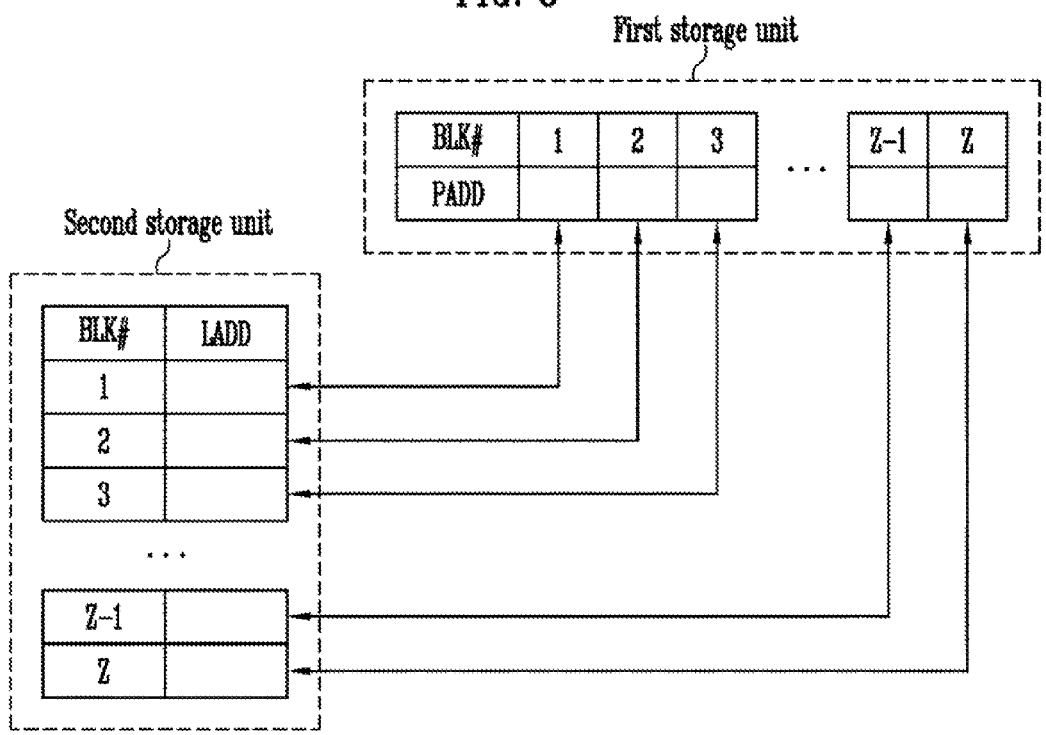

SEMICONDUCTOR DEVICE AND METHOD OF OPERATING THE SAME

CROSS-REFERENCE TO RELATED APPLICATION

The present application claims priority to Korean patent application number 10-2013-0023387 filed on Mar. 5, 2013, in the Korean Intellectual Property Office, the entire disclosure of which is incorporated by reference herein.

BACKGROUND

1. Technical Field

Various embodiments relate generally to a semiconductor device and a method of operating the same and, more particularly, to a program operation.

2. Related Art

A semiconductor device includes a memory cell array in which data are stored. A non-volatile memory device includes a plurality of memory blocks, and each of the memory blocks includes a plurality of pages. A page refers to a group of memory cells coupled to the same word line. In general, a program operation is performed in order of page number. A page address is allocated to each page. A program operation may be performed on each corresponding page according to a page address being input during the program operation. For example, when first and fifth pages are programmed, a sixth or any subsequent page is to be programmed. If any one of the second to fourth pages is programmed, interference may occur between the first to fifth pages having already been programmed. Therefore, the semiconductor device is set to be programmed in the order of page numbers.

However, when a user executes a program operation on a page that violates a program order, the semiconductor device may perform the program operation according to a page address input by the user unless it includes a device or an algorithm designed to detect and control a violation of the program order. As a result, other pages having been programmed may experience interference, which may reduce the reliability of the stored data.

BRIEF SUMMARY

Various embodiments relate to a semiconductor device capable of forcibly terminating a program operation when a program operation order violates a normal order, and a method of operating the same.

An exemplary semiconductor device may include a memory cell array including a plurality of memory blocks, each of the memory blocks including a plurality of pages, wherein at least one of the plurality of memory blocks functions as a first storage unit to store a plurality of page addresses associated with the plurality of pages; a second storage unit into which a page address, of the plurality of page addresses, stored in the first storage unit is loaded; and a control circuit configured to cancel a program operation if an externally inputted page address is less than or equal to the page address loaded into the second storage unit, and perform the program operation and update the second storage unit with the externally inputted page address if the externally input page address is greater than the page address loaded into the second storage unit.

An exemplary method of operating a semiconductor device may include comparing a first page address, corresponding to a programmed page, to a second page address, corresponding to a page to be subsequently programmed; performing a program operation on the page to be subsequently programmed, if the second page address is determined to be greater than the first page address based on the comparison; and canceling the program operation if the second page address is determined to be less than or equal to the first page address based on the comparison.

An exemplary method of operating a semiconductor device may include loading a first page address, stored in a first storage unit, into a second storage unit; updating the first page address, stored in the second storage unit, with a second page address, input from an external device; performing a subsequent program operation, if the second page address is greater than the first page address; canceling the subsequent program operation if the second page address is less than or equal to the first page address; and transferring the second page address, stored in the second storage unit, to the first storage unit if the program operation is canceled.

BRIEF DESCRIPTION OF THE DRAWINGS

FIG. 7 is a flowchart illustrating a delay time sensing operation of FIG. 4 in detail; and FIG. 8 is a detailed view of storage units in each of which a page address is stored.

DETAILED DESCRIPTION

Hereinafter, various embodiments will be described in detail with reference to the accompanying drawings. The figures are provided to allow those having ordinary skill in the art to understand the scope of the embodiments of the disclosure. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

Figure 1:
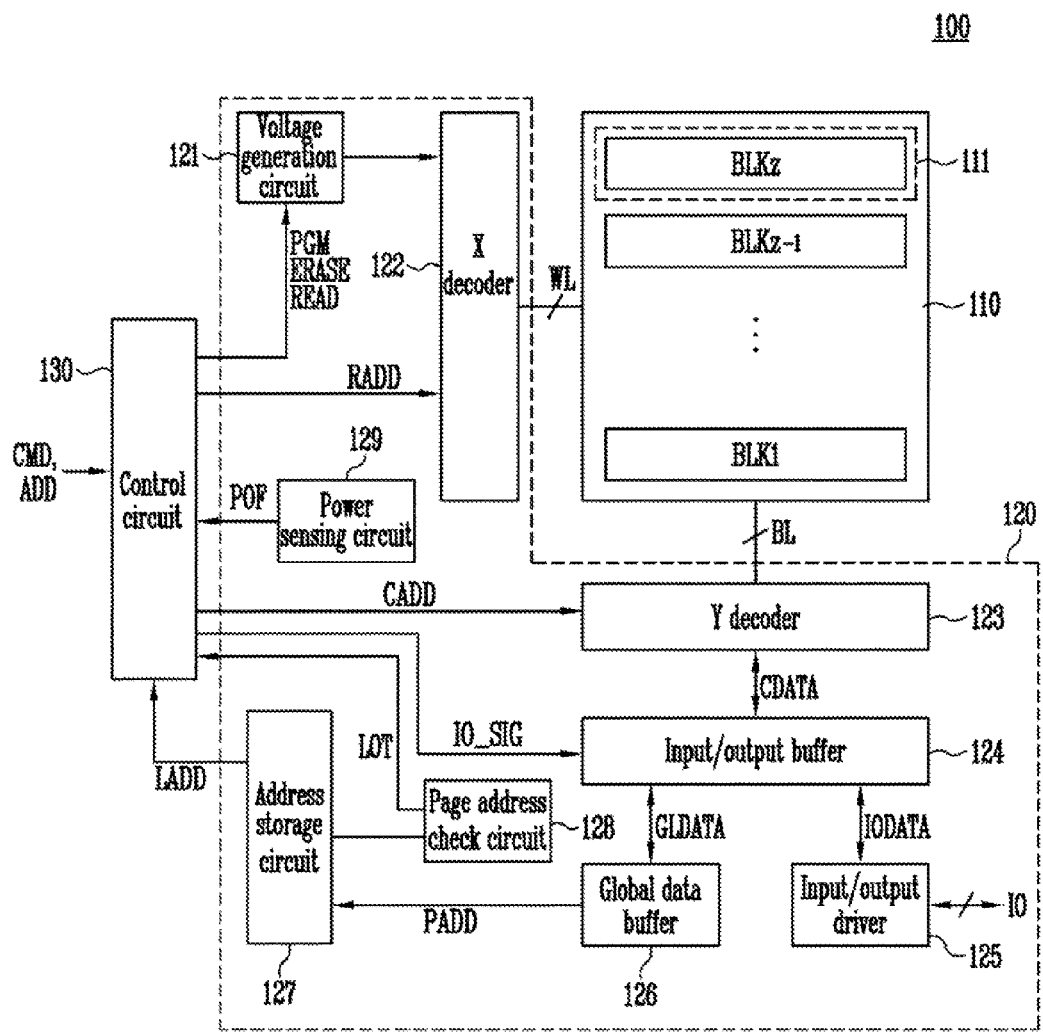
FIG. 1 is block diagram of an exemplary semiconductor device.

FIG. 1 is a block diagram of an exemplary semiconductor device.

Referring to FIG. 1, a semiconductor device 100 may include a memory cell array 110 and peripheral circuits 120. The memory cell array 110 may store data therein. The peripheral circuits 120 may perform program, erase and read operations on the memory cell array 110.

The memory cell array 110 may include a plurality of memory blocks BLK1 to BLKz that may have the same configuration. Each of the memory blocks may include a plurality of pages. A page may refer to a group of memory cells included in different strings. Any one of the plurality of memory blocks BLK1 to BLKz may function as a first storage unit 111 in which page addresses are stored.

The peripheral circuits 120 may include a voltage generation circuit 121, an X decoder 122, a Y decoder 123, an input/output buffer 124, an input/output driver 125, a global data buffer 126, an address storage circuit 127, a page address check circuit 128 and a power sensing circuit 129. The peripheral circuits 120 may be configured to program, erase and read the memory cells included in the memory cell array 110 under control of the control circuit 130. For example, a program operation may be performed on a selected page, among a plurality of pages included in a selected memory block. An erase operation may be performed on the selected memory block, among the plurality of memory blocks. A read operation may be performed on the selected page included in the selected memory block.

The voltage generation circuit 121 may be configured to generate voltages necessary for various operations in response to a program signal PGM, an erase signal ERASE or a read signal READ output from the control circuit 130.

The X decoder 122 may be configured to transfer the voltages, generated by the voltage generation circuit 121, to word lines WL of the selected memory block in response to a row address RADD output from the control circuit 130.

The Y decoder 123 may be configured to exchange data through bit lines BL coupled to the memory cell array 110 in response to a column address CADS output from the control circuit 130.

The input/output buffer 124 may be configured to exchange data CDATA with the Y decoder 123 in response to an input/output signal IO_SIG output from the control circuit 130.

The input/output driver 125 may be configured to externally receive data IO or output data IODATA transferred from the input/output buffer 124.

The global data buffer 126 may receive global data GLDATA corresponding to page addresses from the input/output buffer 124 and output the global data GLDATA as page addresses PADD.

The address storage circuit 127 may include a second storage unit (see FIG. 8). The address storage circuit 127 may be configured to receive the page addresses PADD corresponding to pages that are programmed during a program operation, store the page addresses PADD in the second storage unit and transfer last page addresses LADD corresponding to last programmed page pages to the control circuit 130 when the program operation is completed.

The page address check circuit 128 may be configured to check whether or not the page addresses PADD are inputted to the second storage unit after the program operation is completed. When the page address check circuit 128 checks that the page addresses PADD are not inputted to the second storage unit, the page address check circuit 128 may be configured to output a delay signal LOT since a time delay occurs. When the delay signal LOT is inputted to the control circuit 130, the control circuit 130 may control the peripheral circuits 120 so that the page addresses corresponding to the programmed pages may be input to the second storage unit.

The power sensing circuit 129 may be configured to output, when power supplied to the semiconductor device 100 is turned off, a power off signal POF to the control circuit 130 in order to perform a subsequent operation when power is supplied to the semiconductor device 100.

The control circuit 130 may be configured to control the peripheral circuits 120 in response to a command signal CMD and an address ADD. In particular, during a program operation, if a page address inputted from an external device is greater than a page address of a last programmed page in a previous program operation, the control circuit 130 may control the peripheral circuits 120 to perform the program operation on a page corresponding to the page address inputted from the external device. If the page address inputted from the external device is less than or equal to the page address of the last programmed page in the previous program operation, the control circuit 130 may control the peripheral circuits 120 to terminate the program operation.

Figure 2:
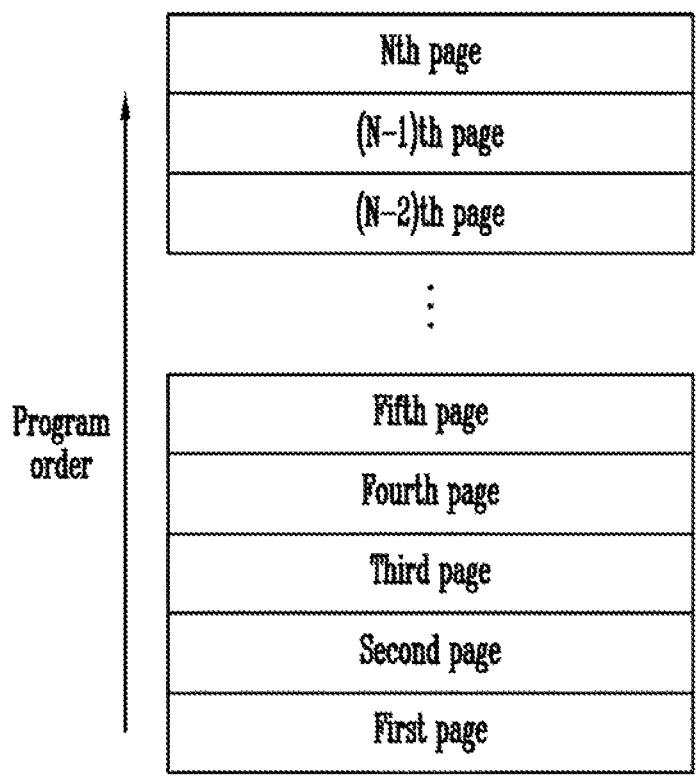
FIG. 2 is a schematic view of an exemplary memory block, illustrating a program order according.

FIG. 2 is a schematic view of a memory block to illustrate an exemplary program operation.

Referring to FIG. 2, the memory cell array 110 of FIG. 1 may include the plurality of memory blocks BLK1 to BLKz of FIG. 1. Each of the memory blocks may have the same configuration. FIG. 2 illustrates any one of the memory blocks, e.g., the memory block BLK. The memory block BLK may include first to N-th pages. A page may refer to a group of memory cells coupled to the same word line. In other words, the plurality of memory cells may be coupled to the first to N-th pages. Some of the memory cells coupled to the first to N-th pages may be classified as flag cells. A portion of the memory cells function as normal memory cells, and another portion of the memory cells function as flag cells, which store data about various operations of the semiconductor device.

The semiconductor device may perform various operations such as program, erase and read operations. In particular, a program operation is to be performed by selecting the first to N-th pages in a sequential order. For example, if a program operation on the first page is completed, then a subsequent program operation will be performed on a second or any subsequent page, for example, a second page or a third page.

If a user violates this order, for example, if the first and fifth pages are programmed, then, if the user tries to program a fourth page, pages that have already been programmed may experience interference. A page address may be allocated to each of the pages. A page corresponding to a page address being input may be selected during a program operation. In general, a program operation may be performed with sequentially increasing page addresses according to a fixed algorithm. However, a page address may be designated by the user or the external device. According to an exemplary implementation of the present invention, a program operation may be performed in such a manner that the program operation may be forcibly terminated when the page address input by the user or the external device is less than the page address of the last programmed page.

Figure 3:
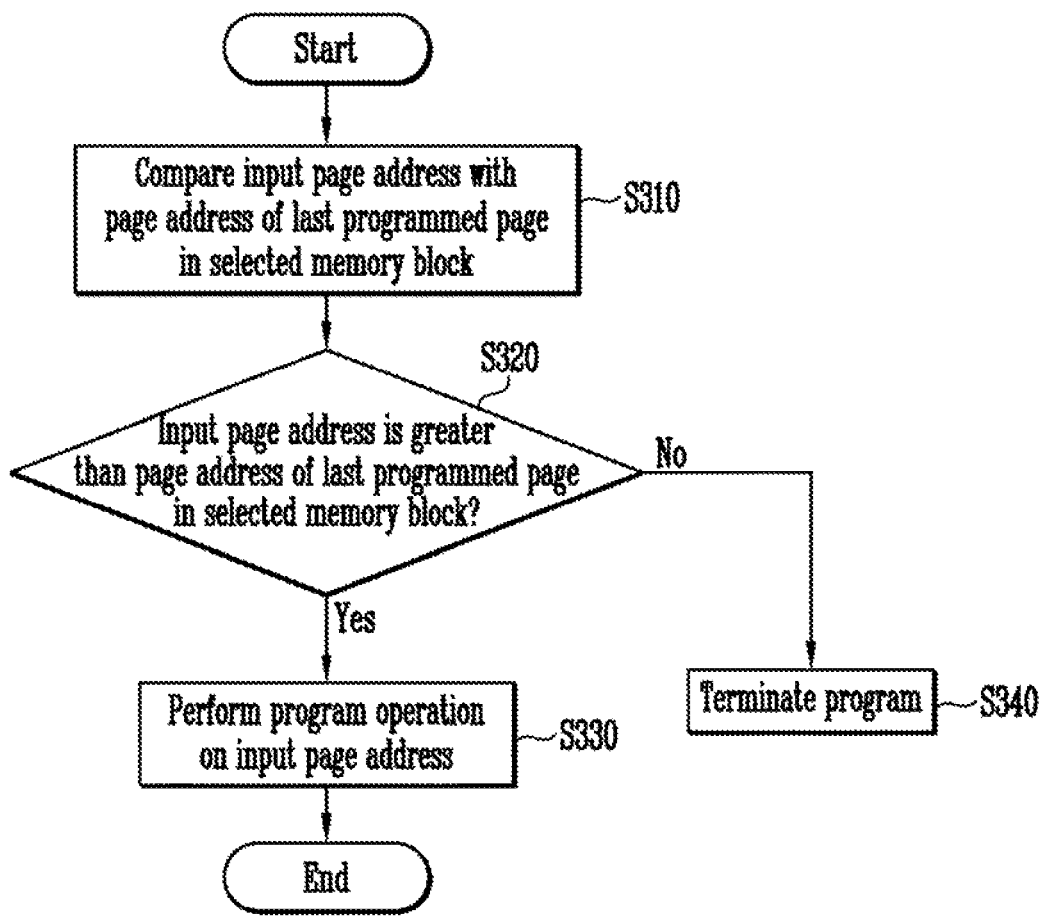
FIG. 3 is a flowchart illustrating an operating order of an exemplary semiconductor device.

FIG. 3 is a flowchart illustrating an operating order of an exemplary semiconductor device.

Referring to FIG. 3, when a program operation of a semiconductor device starts, a page address corresponding to a programmed page in a previous program operation may be compared with an externally inputted page address at step S310. The externally inputted page address may be input by the user to perform the program operation.

As a result of the comparison at step S310, if the externally input page address is greater than the page address of the last programmed page in the selected memory block at step S320 then the program operation may be performed on the externally input page address at step S330.

As the result of the comparison at step S310 if the externally input page address is less than or equal to the page address of the last programmed page in the selected memory block at step S320, then the program operation on the externally input page address may be forcibly terminated at step S340.

In other words, during a program operation, if a page address that violates the order of numbers of the page addresses is inputted, then programmed data may be protected by forcibly terminating the corresponding program operation.

Hereinafter, a description will be made to an exemplary method of operating a semiconductor device that can efficiently manage a page address.

Figure 4:
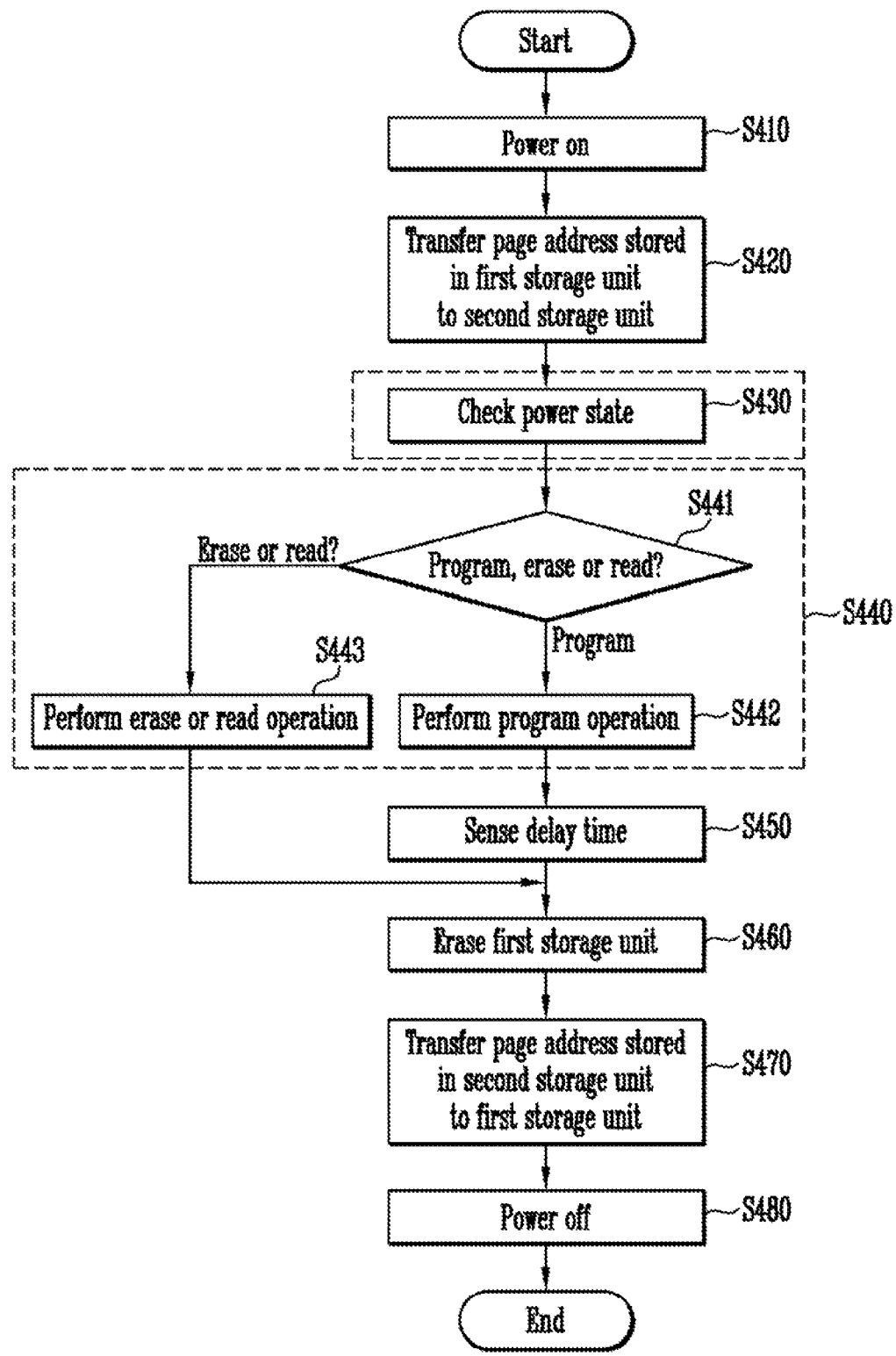
FIG. 4 is a flowchart illustrating an operating order of an exemplary semiconductor device.

FIG. 4 is a flowchart illustrating an operating order of an exemplary semiconductor device.

Referring to FIG. 4, if a power of the semiconductor device is ON at step S410, then the page addresses stored in the first storage unit 111 of FIG. 1 may be loaded into the second storage unit at step S420. At the same time, data, which are stored in the first storage unit, about the states of the memory blocks may also be loaded. The page addresses stored in the first storage unit may correspond to the last programmed pages in the previous program operation. Each of the page addresses stored in the first storage unit 111 of FIG. 1 may correspond to each of the page addresses stored in the second storage unit. The first storage unit 111 of FIG. 1 and the second storage unit will be described below in detail with reference to FIG. 8.

FIG. 8 is a detailed view of a storage unit in which page addresses are stored.

Referring to FIG. 8, the first storage unit 111 of FIG. 1 may include the page addresses PADD of the last programmed pages in the previous program operation, among the pages included in the memory blocks BLK1 to BLKz, and may also include the state data of the memory blocks BLK1 to BLKz. For example, if a memory block is in an erase state, then the data [00h], indicating the erase state, may be inputted. On the other hand, if a memory block is a bad block, then the data of [FFh] may be inputted. In other words, if the page addresses are stored, then the state data of the corresponding memory blocks and the page addresses corresponding to the last programmed pages may be stored in storages of the memory blocks.

Therefore, similar to step S420 of FIG. 4, if the data stored in the first storage unit 111 of FIG. 1 are loaded into the second storage unit, then the same state data and the same page address may be stored in the first storage unit 111 of FIG. 1 and the second storage unit.

After the data stored in the first storage unit 111 of FIG. 1 are loaded into the second storage unit at step S430, a power state of the semiconductor device may be checked at step S430. The power state of the semiconductor device is checked at step S430, and it is determined whether or not a sudden power off has occurred. If it is determined that the power of the semiconductor device is normally off in the previous operation, then the page addresses input to the second storage unit may be inputted. If it is determined that the power of the semiconductor device is abnormally off in the previous operation, then the page address of the last programmed page in the first storage unit may are not inputted. Since the page address stored in the first storage unit is transferred to the second storage unit at step S420, the state data of each of the memory blocks of the second storage unit may be sequentially read, and a memory block in an erase state may be selected. A subsequent program operation may be performed on the selected memory block. The power state check operation at step S430 will be described in detail with reference to FIG. 5.

Operations may be performed on the selected memory block at step S440. For example, in response to the command signal CMD of the control circuit 130 of FIG. 1, it is determined whether a program, erase or read operation is performed at step S441. The program operation may be performed if the command signal CMD is a program command signal at step S442, and the erase or read operation may be performed if the command signal CMD is an erase or read command signal at step S443.

The erase and read operations may be performed by a conventional method since the erase and read operations are performed regardless of the order of page addresses. However, as for the program operation, the previously stored data may be damaged due to interference if the order of page addresses is violated. As a result, the program operation may be forcibly terminated. If a page address inputted from an external device (or a page address input by a user), does not violate the order of page addresses, then the program operation may be performed. During the program operation, a programmed page address may be frequently updated in the second storage unit. Step S440 will be described in detail with reference to FIG. 6.

Subsequently, at step S450, a delay time sensing operation may be performed to detect whether or not there is a delay in the time of the program operation of the semiconductor device. For example, as described above with respect to S440, page addresses of pages that are programmed during the program operation may be frequently updated in the second storage unit. If there is a delay in the time, then the second storage unit may not be updated with the page addresses. For example, it may be checked whether or not the page addresses are input by reading the second storage unit. If the page address is not inputted, then the page address of the last programmed page may be forcibly stored in the storage of the selected memory block. The delay time sensing operation at step S450 will be described in detail with reference to FIG. 7.

All the page addresses stored in the first storage unit may be erased at step S460. More specifically, since the page addresses of the pages programmed during the program operation are stored in the second storage unit, the first storage unit may store only the page addresses of the previous operation. Therefore, since the page addresses of the previous operation are unnecessary, the page addresses stored in the first storage unit may be erased.

To perform subsequent operations, the page addresses stored in the second storage unit may be transferred to the first storage unit at step S470, and the power of the semiconductor device may be turned off at step S480.

Among the above-described operations, the operations at steps S430, S440 and S450 will be described below in more detail.

Figure 5:
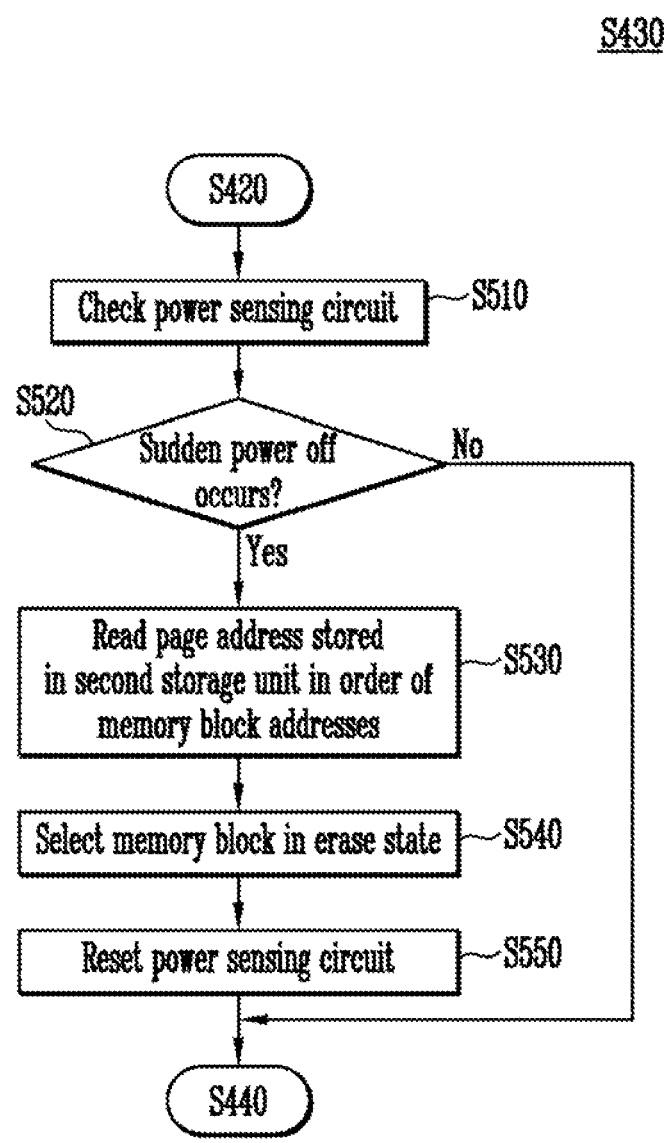
FIG. 5 is a flowchart illustrating, in detail, a power state checking operation of FIG. 4.

FIG. 5 is a flowchart illustrating, in detail, the power state checking operation of step S430.

Referring, to FIG. 5, when all the page addresses stored in the first storage unit are loaded into the second storage unit at step S420 a power state may be checked at step S430. The power state may be sensed by the power sensing circuit 129 of FIG. 1. For example, if the power of the semiconductor device 100 of FIG. 1 is suddenly turned off in the previous operation, then the power sensing circuit 129 may sense a sudden power off and generate fail data. The fail data may be stored in the power sensing circuit 129. If the fail data are generated, then the power sensing circuit 129 may generate the power off signal POF during the power state checking operation. At step S520, in response to the power off signal POF, the control circuit 130 of FIG. 1 may determine whether or not a sudden power off has occurred. For example, the control circuit 130, to which the power off signal POF is output, may determine that the sudden power off has occurred. If the power off signal POF is deactivated, then the control circuit 130 may determine that a sudden power off has not occurred.

If the control circuit 130 determines that the sudden power off has occurred, then the control circuit 130 may find a memory block in an erase state from the page addresses stored in the second storage unit at step S530. For example, the control circuit 130 may sequentially read the page addresses from the second storage unit in ascending order of the memory block numbers at step S530. In other words, corresponding page addresses may be read with sequentially increasing memory block numbers. As a result, if a memory block in an erase state is detected, then this memory block may be selected and used in a program operation at step S540. Subsequently, the power sensing circuit 129 may be reset, and step S440, as shown in FIG. 4, may be performed. If the power sensing circuit 129 is reset, then the fail data may be deleted. If it is determined that the sudden power off does not occur at step S520, then step S440 of FIG. 4 may be immediately performed.

Figure 6:
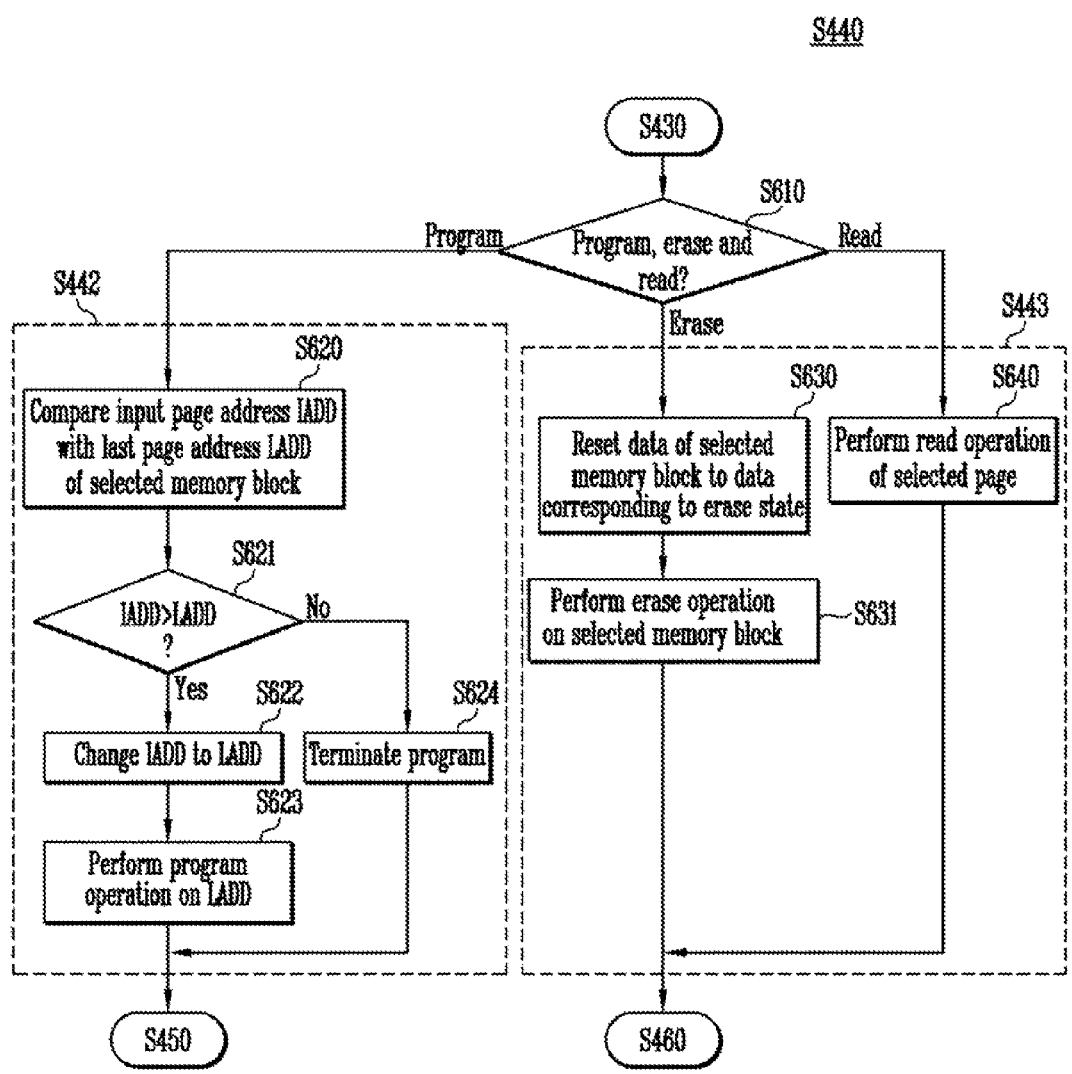
FIG. 6 is a flowchart illustrating, in detail, a program, erase or read operation of FIG. 4.

FIG. 6 is a flowchart illustrating, in detail, the program, erase or read operation performed at step S440, as shown in FIG. 4.

Referring to FIG. 6, after the power state is checked at step S430, the control circuit 130 may control the peripheral circuits to perform a program, erase or read operation in response to the command signal CMD at step S610.

If the program operation is performed at step S442, then a page address IADD, inputted from an external device, and the last page address LADD of the last programmed page in the selected memory block may be compared with each other at step S620. For example, since the last page address LADD of the last programmed page in the selected memory block is stored in the second storage unit, the last page address LADD stored in the second storage unit and the page address IADD, inputted from the external device, may be compared with each other at step S620. As a result of this comparison, if it is determined that the page address IADD is greater than the last page address LADD, then the last page address LADD stored in the storage of the selected memory block of the second storage unit may be changed to the page address IADD at step S622. Subsequently, the program operation may be performed on the page corresponding to the changed page address at step S623. Page addresses of pages programmed during a program operation may be updated every predetermined period in the second storage unit. As a result of comparison at step S621, if it is determined that the page address IADD is less than or equal to the last page address LADD, then a program order may be violated. Therefore, a program operation on the page corresponding to the page address IADD may be skipped, and the corresponding program operation may be forcibly terminated at step S624. Subsequently, step at S450, as shown in FIG. 4, may be performed.

If the erase operation is performed at step S443 the then state data of the selected memory block in the second storage unit may be reset to data corresponding to an erase state at step S630. Subsequently, an erase operation may be performed on the selected memory block at step S631.

If the read operation is performed at step S443 then the read operation may be performed on the selected page without changing the page addresses stored in the second storage unit at step S640.

When the erase or read operation is completed, step S460 as shown in FIG. 4 may be performed.

FIG. 7 is a flowchart illustrating, in detail, the de time sensing operation of FIG. 4.

Referring to FIG. 7, if the program operation is terminated, then the second storage unit may be read by the page address check circuit 128 of FIG. 1 at step S718. For example, it may be checked by the page address check circuit 128 of FIG. 1 whether the page address is stored in the second storage unit at step S720. As a checking result, if it is checked that the page address is not updated, then the page address may be updated in the second storage unit at step S730. More specifically, as a result of reading the page address and the state data of the selected memory block in the second storage unit, if it is determined that the page address is not updated or in an erase state, then it means that the page address corresponding to the programmed page is not updated. Therefore, the delay signal LOT of FIG. 1, which indicates that a delay time is sensed, may be output to the control circuit 130 of FIG. 1. If the delay signal LOT is inputted to the control circuit 130, then the control circuit 130 may control the peripheral circuits so that the page address of the last programmed page may be stored in the storage of the corresponding memory block. At this time, the state data may be updated with data indicating the program state. After the data are updated, step S460 of FIG. 4 may be performed. If it is determined that a delay time does not occur at step S720, then step S460 of FIG. 4 may be performed without updating the page address.

As described above, if a page address order is violated during a program operation, then the program operation may be skipped by forcibly terminating the program operation, so that a reduction in reliability of the previously programmed data may be prevented.

In addition, subsequent operations may be controlled by managing page addresses. Even if a power off occurs, subsequent operations may be controlled based on such information, thereby improving the reliability of operations of the semiconductor device.

According to the present invention, if a program operation order violates a normal order, then a corresponding program operation may be skipped by forcibly terminating the program operation to thereby prevent previously stored data from experiencing interference. As a result, reliabilities of program and read operations may be improved.

What is claimed is:

1. A semiconductor device, comprising:
   a memory cell array including a plurality of memory blocks, each of the memory blocks including a plurality of pages, wherein at least one of the plurality of memory blocks functions as a first storage unit to store a plurality of page addresses associated with the plurality of pages;
   a second storage unit into which a page address, of the plurality of page addresses, stored in the first storage unit is loaded; and
   a control circuit configured to cancel a program operation if an externally inputted page address is less than or equal to the page address loaded into the second storage unit, perform the program operation and update the second storage unit with the externally inputted page address if the externally inputted page address is greater than the page address, transfer the externally inputted page address to the first storage unit if the program operation is canceled, read the second storage unit after the program operation is terminated to determine whether or not a delay time has occurred, and determine that the delay time has occurred if a page address corresponding to a last programmed page is stored in the second storage unit and that the delay time has not occurred if the page address corresponding to the last programmed page is not stored in the second storage unit.

2. The semiconductor device of claim 1, further comprising:
   peripheral circuits configured to perform the program operation on a page corresponding to the externally inputted page address.

3. The semiconductor device of claim 2, wherein the peripheral circuits include:

a voltage generation circuit configured to generate voltages for the program operation in response to a program signal output from the control circuit;

an X decoder configured to transfer the voltages, generated by the voltage generation circuit, to word lines of a selected memory block, of the plurality of memory blocks, in response to a row address output from the control circuit;

a Y decoder configured to exchange data through bit lines coupled to the memory cell array in response to a column address output from the control circuit;

an input/output buffer configured to exchange the data with the Y decoder in response to an input/output signal output from the control circuit;

an input/output driver configured to externally receive data or externally output the data transferred from the input/output buffer;

a global data buffer configured to receive global data corresponding to a page address from the input/output buffer and output the global data as the page address; and an address storage circuit, including the second storage unit, and configured to receive the page address from the global data buffer, store the page address in the second storage unit, and transfer a last stored page address to the control circuit when the program operation is completed.

4. The semiconductor device of claim 3, further comprising:
a page address check circuit configured to output a delay signal if a delay time occurs for a predetermined period of time during the program operation; and
a power sensing circuit configured to determine if power to the semiconductor device turns off, and output a power off signal to the control circuit if the power is supplied to the semiconductor device to perform a subsequent operation.

5. The semiconductor device of claim 4, wherein the page address check circuit outputs the delay signal if the page address is not stored in the second storage unit after the program operation is completed or terminated.

6. The semiconductor device of claim 4, wherein the control circuit reads the second storage unit to find a memory block in an erase state and selects the memory block to perform a new program operation thereon if the power off signal is outputted.

7. The semiconductor device of claim 6, wherein the power sensing circuit selects the memory block to perform the new program operation thereon and is subsequently reset.

8. The semiconductor device of claim 4, wherein the control circuit controls the peripheral circuits to:
erase data stored in the first storage unit if the program operation is terminated, and
transfer the page address stored in the second storage unit to the first storage unit.

9. The semiconductor device of claim 1, wherein the control circuit controls the peripheral circuits to:
reset information about a selected memory block in the second storage unit during an erase operation,
perform the erase operation, and
transfer the page address stored in the second storage unit to the first storage unit.

10. The semiconductor device of claim 1, wherein the control circuit controls the peripheral circuits to:
read a selected page of the plurality of pages and,
transfer the page address, stored in the second storage unit, to the first storage unit during a read operation.

11. A method of operating a semiconductor device, the method comprising:
loading a first page address, stored in a first storage unit, into a second storage unit;
updating the first page address, stored in the second storage unit, with a second page address, input from an external device;
performing a subsequent program operation if the second page address is greater than the first page address;
canceling the subsequent program operation if the second page address is less than or equal to the first page address;
transferring the second page address, stored in the second storage unit, to the first storage unit if the program operation is canceled;
reading the second storage unit after the program operation is terminated to determine whether or not a delay time has occurred; and
determining that the delay time has occurred if a page address corresponding to a last programmed page is stored in the second storage unit and that the delay time has not occurred if the page address corresponding to the last programmed page is not stored in the second storage unit.

12. The method of claim 11, further comprising:
loading the first page address, stored in the first storage unit, into the second storage unit; and
checking a power state of the semiconductor device.

13. The method of claim 12, wherein if, as a result of the checking a power state of the semiconductor device, it is determined that a sudden power off occurred in a previous operation, then the second storage unit will be read to find a memory block in an erase state, and the memory block in the erase state will be selected as a memory block on which the subsequent program operation will be performed.

* * * * *